(12) United States Patent
Chou et al.

(10) Patent No.: US 10,964,810 B2
(45) Date of Patent: Mar. 30, 2021

(54) METHODOLOGY AND STRUCTURE FOR FIELD PLATE DESIGN

(71) Applicant: Taiwan Semiconductor Manufacturing Co., Ltd., Hsin-Chu (TW)

(72) Inventors: Hsueh-Liang Chou, Jhubei (TW); Dah-Chuen Ho, Zhubei (TW); Hui-Ting Lu, Zhudong Township (TW); Po-Chih Su, New Taipei (TW); Pei-Lun Wang, Zhubei (TW); Yu-Chang Jong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/578,292

(22) Filed: Sep. 21, 2019

(65) Prior Publication Data

US 2020/0020802 A1 Jan. 16, 2020

Related U.S. Application Data

(60) Division of application No. 15/927,281, filed on Mar. 21, 2018, now Pat. No. 10,636,904, which is a (Continued)

(51) Int. Cl.
*H01L 29/40* (2006.01)
*H01L 29/78* (2006.01)
(Continued)

(52) U.S. Cl.
CPC ........ *H01L 29/7816* (2013.01); *H01L 21/761* (2013.01); *H01L 23/49562* (2013.01);
(Continued)

(58) Field of Classification Search
CPC ..... H01L 29/40; H01L 29/402; H01L 29/404; H01L 29/407
See application file for complete search history.

(56) References Cited

U.S. PATENT DOCUMENTS 4,288,803 A 9/1981 Ronen
4,290,077 A 9/1981 Ronen
(Continued)

OTHER PUBLICATIONS

Non-Final Office Action dated Oct. 7, 2019 in connection with U.S. Appl. No. 15/927,281.
(Continued)

*Primary Examiner* — Michele Fan
(74) *Attorney, Agent, or Firm* — Eschweiler & Potashnik, LLC

(57) ABSTRACT

The present disclosure, in some embodiments, relates to a method of forming an integrated chip. The method may be performed by forming a source region and a drain region within a substrate. A gate structure is formed over the substrate and between the source region and the drain region. One or more dielectric layers are formed over the gate structure, and a first inter-level dielectric (ILD) layer is formed over the one or more dielectric layers. The first ILD layer laterally surrounds the gate structure. The first ILD layer is etched to define contact openings and a field plate opening. The contact openings and the field plate opening are filled with a conductive material.

20 Claims, 10 Drawing Sheets

Related U.S. Application Data division of application No. 15/424,333, filed on Feb. 3, 2017, now Pat. No. 9,954,097, which is a continuation of application No. 14/604,885, filed on Jan. 26, 2015, now Pat. No. 9,590,053.

(60) Provisional application No. 62/084,038, filed on Nov. 25, 2014.

(51) Int. Cl.
  *H01L 29/417* (2006.01)
  *H01L 29/66* (2006.01)
  *H01L 21/761* (2006.01)
  *H01L 23/495* (2006.01)
  *H01L 29/10* (2006.01)

(52) U.S. Cl.
  CPC ...... *H01L 23/49575* (2013.01); *H01L 29/402* (2013.01); *H01L 29/407* (2013.01); *H01L 29/4175* (2013.01); *H01L 29/66659* (2013.01); *H01L 29/66681* (2013.01); *H01L 29/66689* (2013.01); *H01L 29/7835* (2013.01); *H01L 29/1045* (2013.01); *H01L 29/1087* (2013.01)

(56) References Cited

U.S. PATENT DOCUMENTS

| | | |
|---|---|---|
| 5,362,979 A | 11/1994 | Merchant |
| 5,374,843 A | 12/1994 | Williams et al. |
| 5,625,217 A | 4/1997 | Chau et al. |
| 5,831,320 A | 11/1998 | Kwon et al. |
| 6,160,290 A | 12/2000 | Pendharkar et al. |
| 6,465,845 B1 | 10/2002 | Baek |
| 8,173,510 B2 | 5/2012 | Denison et al. |
| 9,590,053 B2 | 3/2017 | Chou et al. |
| 9,871,132 B1 | 1/2018 | Liu et al. |
| 9,954,097 B2 | 4/2018 | Chou et al. |
| 2002/0145172 A1 | 10/2002 | Fujishima et al. |
| 2002/0182810 A1 | 12/2002 | Oh |
| 2005/0020021 A1 | 1/2005 | Fujiwara et al. |
| 2005/0110042 A1 | 5/2005 | Saito et al. |
| 2005/0156234 A1 | 7/2005 | Gammel et al. |
| 2006/0113601 A1 | 6/2006 | Shibib et al. |
| 2006/0113625 A1 | 6/2006 | Bude et al. |
| 2007/0114608 A1 | 5/2007 | Letavic |
| 2007/0152343 A1 | 7/2007 | Richter |
| 2007/0167010 A1 | 7/2007 | Furusawa et al. |
| 2007/0278568 A1 | 12/2007 | Williams et al. |
| 2008/0182394 A1 | 7/2008 | Yang et al. |
| 2008/0283844 A1 | 11/2008 | Shinichi |
| 2009/0242937 A1 | 10/2009 | Marui |
| 2010/0026866 A1 | 2/2010 | Matsumoto |
| 2012/0146150 A1 | 6/2012 | Gauthier |
| 2012/0228704 A1 | 9/2012 | Ju |
| 2012/0319182 A1 | 12/2012 | Satoh et al. |
| 2013/0069115 A1* | 3/2013 | Nakazawa ............ H01L 29/402 257/192 |
| 2013/0134512 A1 | 5/2013 | Cheng et al. |
| 2014/0061659 A1 | 3/2014 | Teplik et al. |
| 2014/0264556 A1 | 9/2014 | Lai et al. |
| 2014/0361342 A1 | 12/2014 | Sriram et al. |
| 2014/0367778 A1 | 12/2014 | Sharma et al. |
| 2015/0048447 A1* | 2/2015 | Sharma ................ H01L 29/404 257/337 |
| 2015/0179782 A1 | 6/2015 | Yamamura |
| 2015/0263107 A1* | 9/2015 | Kobayashi ...... H01L 21/823475 257/367 |
| 2015/0380487 A1 | 12/2015 | Yoshida et al. |
| 2016/0149007 A1 | 5/2016 | Chou et al. |
| 2016/0190297 A1 | 6/2016 | Kudymov et al. |
| 2016/0211363 A1 | 7/2016 | Park |
| 2017/0352731 A1 | 12/2017 | Kuo et al. |
| 2018/0219093 A1 | 8/2018 | Chou et al. |
| 2019/0288066 A1 | 9/2019 | Lee |
| 2019/0288112 A1 | 9/2019 | Wang |

OTHER PUBLICATIONS

Final Office Action dated Jan. 28, 2020 in connection with U.S. Appl. No. 16/174,626.

Notice of Allowance dated Dec. 18, 2019 in connection with U.S. Appl. No. 15/927,281.

Non Final Office Action dated Mar. 24, 2020 in connection with U.S. Appl. No. 16/578,293.

Knaipp, et al. "Investigations on an Isolated Lateral High-Voltage n-channel LDMOS Transistor with a Typical Breakdown of 150V." Proceeding of the 36th European Solid-State Device Research Conference, 2006. ESSDERC 2006. Sep. 2006.

Non-Final Office Action dated May 23, 2016 for U.S. Appl. No. 14/604,885.

Notice of Allowance dated Oct. 25, 2016 for U.S. Appl. No. 14/604,885.

Non-Final Office Action dated Jul. 17, 2017 for U.S. Appl. No. 15/424,333.

Notice of Allowance dated Dec. 20, 2017 for U.S. Appl. No. 15/424,333.

Non-Final Office Action dated Oct. 23, 2018 for U.S. Appl. No. 15/927,281.

Final Office Action dated Apr. 8, 2019 for U.S. Appl. No. 15/927,281.

Non-Final Office Action dated Aug. 23, 2019 for U.S. Appl. No. 16/174,626.

* cited by examiner

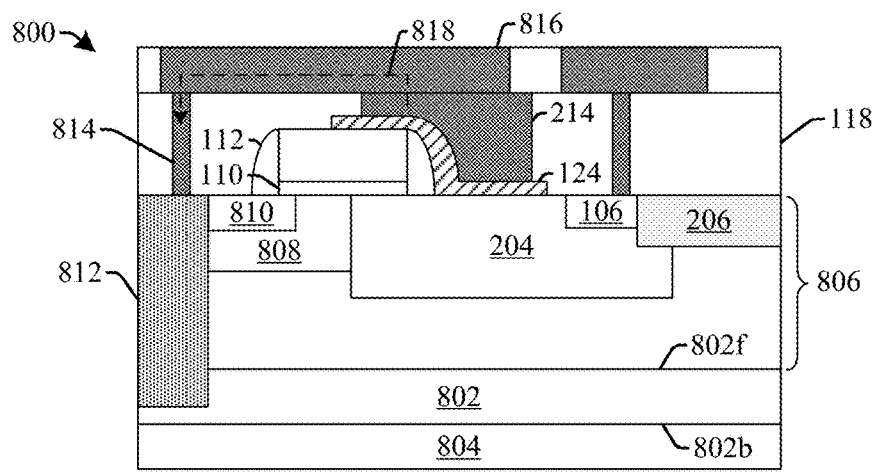
Fig. 8
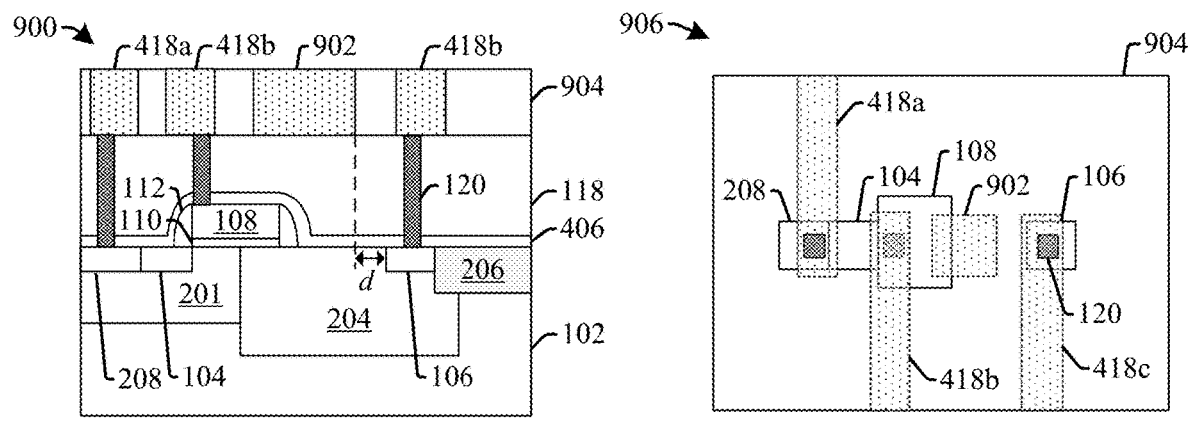
Fig. 9A
Fig. 9B
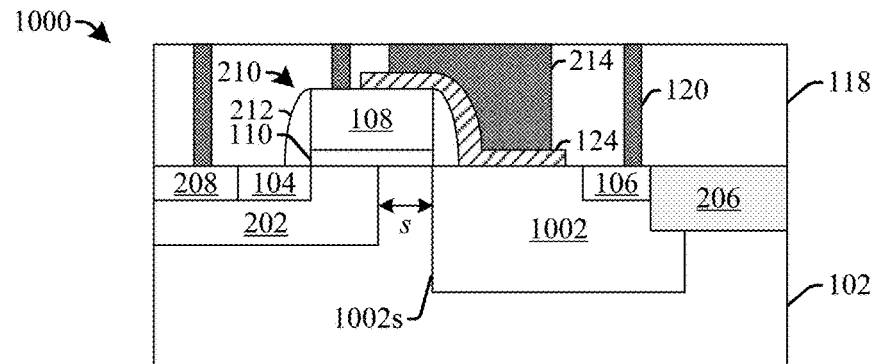
Fig. 10

METHODOLOGY AND STRUCTURE FOR FIELD PLATE DESIGN

REFERENCE TO RELATED APPLICATIONS

This Application is a Divisional of U.S. application Ser. No. 15/927,281, filed on Mar. 21, 2018, which is a Divisional of U.S. application Ser. No. 15/424,333, filed on Feb. 3, 2017 (now U.S. Pat. No. 9,954,097, issued on Apr. 24, 2018), which is a Continuation of U.S. application Ser. No. 14/604,885, filed on Jan. 26, 2015 (now U.S. Pat. No. 9,590,053, issued on Mar. 7, 2017), which claims the benefit of U.S. Provisional Application No. 62/084,038, filed on Nov. 25, 2014. The contents of the above-referenced Patent Applications are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a cross-sectional view of a source downward high voltage transistor device having a field plate.

FIGS. 9A-9B illustrate some embodiments of a disclosed high voltage LDMOS having a field plate on a metal wire layer.

FIG. 10 illustrates some embodiments of a high voltage LDMOS device having a self-aligned drift region.

DETAILED DESCRIPTION

Figure 1:
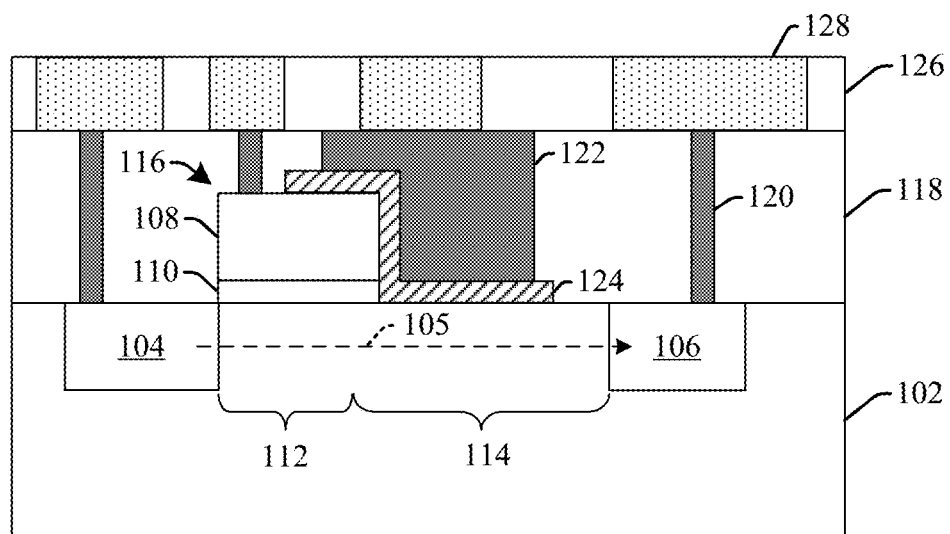
FIG. 1 illustrates a cross-sectional view of some embodiments of a disclosed high voltage transistor device having a field plate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a channel region to enhance the performance of a high voltage transistor device by manipulating electric fields (e.g., reducing peak electric fields) generated by a gate electrode. By manipulating the electric field generated by the gate electrode, the high voltage transistor device can achieve higher breakdown voltages. For example, LDMOS (laterally diffused metal oxide semiconductor) transistor devices often comprise field plates that extend from a channel region to an adjacent drift region disposed between the channel region and a drain region.

Field plates can be formed in a number of different ways. For example, field plates may be formed by extending a conductive gate material (e.g., polysilicon) from a gate electrode towards a drift region. However, in such configurations the field plate is synchronized to a gate bias, which burdens the gate-to-drain capacitance ($C_{gd}$) and worsens the switching losses of the device. Alternatively, the conductive gate material can be patterned to form a separate field plate. Such configurations reduce the gate-to-drain capacitance ($C_{gd}$), but placement of the field plates are often restricted by design rules. In yet another alternative, non-gate materials can be used for field plate formation. However, such solutions use additional processing steps that increase the fabrication cost of a resulting integrated chip.

Accordingly, the present disclosure relates to a high voltage transistor device having a field plate made from non-gate materials, which is formed concurrent with a formation of a back-end-of-the-line (BEOL) metal layer to enable a low-cost method of fabrication. In some embodiments, the high voltage transistor device has a gate electrode disposed over a substrate between a source region and a drain region located within the substrate. A dielectric layer laterally extends from over the gate electrode to a drift region arranged between the gate electrode and the drain region. A field plate is located within a first inter-level dielectric (ILD) layer overlying the substrate. The field plate laterally extends from over the gate electrode to over the drift region and vertically extends from the dielectric layer to a top surface of the first ILD layer. A plurality of metal contacts, having a same material as the field plate, vertically extend from a bottom surface of the first ILD layer to a top surface of the first ILD layer.

FIG. 1 illustrates a cross-sectional view of some embodiments of a disclosed high voltage transistor device 100 having a field plate 122.

The high voltage transistor device 100 comprises a source region 104 and a drain region 106 disposed within a semiconductor substrate 102. The semiconductor substrate 102 has a first doping type, while the source region 104 and the drain region 106 have a second doping type, with a higher doping concentration than the semiconductor substrate 102. In some embodiments, the first doping type may by an n-type doping and the second doping type may be a p-type doping.

A gate structure 116 is disposed over the semiconductor substrate 102 at a position that is laterally arranged between the source region 104 and the drain region 106. The gate structure 116 comprises gate electrode 108 that is separated from the semiconductor substrate 102 by a gate dielectric layer 110. Upon receiving a bias voltage, the gate electrode 108 is configured to generate an electric field that controls the movement of charge carriers within a channel region 112 laterally disposed between the source region 104 and the drain region 106. For example, during operation, a gate-source voltage ($V_{GS}$) can be selectively applied to the gate electrode 108 relative to the source region 104, forming a conductive channel in the channel region 112. While $V_{GS}$ is applied to form the conductive channel, a drain to source voltage ($V_{DS}$) is applied to move charge carriers (e.g., shown by arrow 105) between the source region 104 and the drain region 106.

The channel region 112 laterally extends from the source region 104 to an adjacent drift region 114 (i.e., a drain extension region). The drift region 114 comprises a second doping type having a relatively low doping concentration, which provides for a higher resistance at high operating voltages. The gate structure 116 is disposed over the channel region 112. In some embodiments, the gate structure 116 may extend from over the channel region 112 to a position overlying a portion of the drift region 114.

A first inter-level dielectric (ILD) layer 118 is disposed over the semiconductor substrate 102. One or more conductive metal structures are disposed within the first ILD layer 118. In some embodiments, the one or more conductive metal structures comprise a plurality of contacts 120 configured to provide for a vertical connection between the source region 104, the drain region 106, or the gate electrode 108 and a first back-end-of-the-line (BEOL) metal wire layer 128 disposed within a second ILD layer 126 overlying the first ILD layer 118.

The one or more conductive metal structures may further comprise a field plate 122 disposed within the first ILD layer 118 at a position overlying portions of the gate electrode 108 and the drift region 114. The field plate 122 comprises a same conductive material as the plurality of contacts 120. The field plate 122 may be disposed over a dielectric layer 124 configured to separate the field plate 122 the drift region 114 and the gate electrode 108. In some embodiments, the dielectric layer 124 laterally extends past the field plate 122 in one or more directions.

During operation, the field plate 122 is configured to act upon the electric field generated by the gate electrode 108.

The field plate 122 may be configured to change distribution of the electric field generated by the gate electrode 108 in the drift region 114, which enhances the internal electric field of the drift region 114 and increases the drift doping concentration of the drift region 114, thereby enhancing the breakdown voltage capability of the high voltage transistor device 100.

Figure 2:
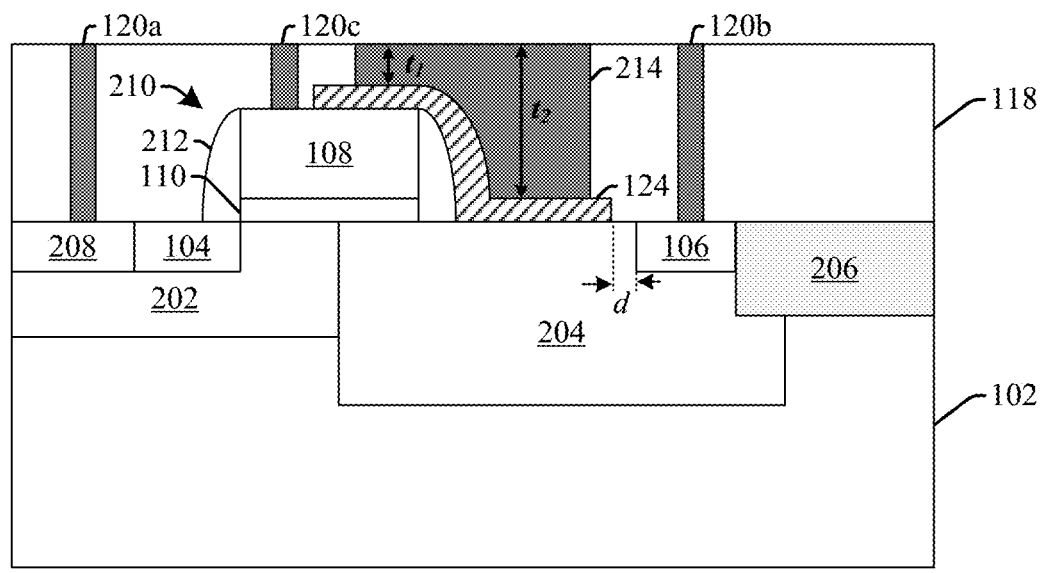
FIGS. 2-4 illustrate cross-sectional views of some additional embodiments of disclosed high voltage laterally diffused MOSFET (LDMOS) devices having a field plate.

FIG. 2 illustrates a cross-sectional view of some additional embodiments of disclosed high voltage transistor device comprising a high voltage laterally diffused MOSFET (LDMOS) device 200 having a field plate 214.

The LDMOS device 200 comprises a source region 104 and a drain region 106 disposed within a semiconductor substrate 102. The semiconductor substrate 102 has a first doping type, while the source region 104 and the drain region 106 comprise highly doped regions having a second doping type different than the first doping type. In some embodiments, the first doping type may be p-type and the second doping type may be n-type. In some embodiments, the source region 104 and the drain region 106 may have doping concentrations that are in a range of between approximately $10^{19}$ cm$^{-3}$ and approximately $10^{20}$ cm$^{-3}$.

A contact region 208 (e.g., a 'p-tap' or an 'n-tap') having the first doping type (e.g., a p+ doping) laterally abuts the source region 104. The contact region 208 provides for an ohmic connection to the semiconductor substrate 102. In some embodiments, the contact region 208 may have a p-type doping concentration that is in a range of between approximately $10^{18}$ cm$^{-3}$ and approximately $10^{20}$ cm$^{-3}$. The contact region 208 and the source region 104 are disposed within a body region 202. The body region 202 has the first doping type with a doping concentration that is higher than that of the semiconductor substrate 102. For example, the semiconductor substrate 102 may have a doping concentration that is in a range of between approximately $10^{14}$ cm$^{-3}$ and approximately $10^{16}$ cm$^{-3}$, while the body region 202 may have a doping concentration that is in a range of between approximately $10^{16}$ cm$^{-3}$ and approximately $10^{18}$ cm$^{-3}$.

The drain region 106 is disposed within a drift region 204 that is arranged within the semiconductor substrate 102 at a position laterally abutting the body region 202. The drift region 204 comprises a second doping type having a relatively low doping concentration, which provides for a higher resistance when the LDMOS device 200 is operated at a high voltage. In some embodiments, the drift region 204 may have a doping concentration that is in a range of between approximately $10^{15}$ cm$^{-3}$ and approximately $10^{17}$ cm$^{-3}$.

A gate structure 210 is disposed over the semiconductor substrate 102 at a position that is laterally arranged between the source region 104 and the drain region 106. In some embodiments, the gate structure 210 may laterally extend from over the body region 202 to a position overlying a portion of the drift region 204. The gate structure 210 comprises a gate electrode 108 that is separated from the semiconductor substrate 102 by a gate dielectric layer 110. In some embodiments, the gate dielectric layer 110 may comprise silicon dioxide ($SiO_2$) or a high-k gate dielectric material and the gate electrode 108 may comprise polysilicon or a metal gate material (e.g., aluminum). In some embodiments, the gate structure 210 may also comprise sidewall spacers 212 disposed on opposing sides of the gate electrode 108. In various embodiments, the sidewall spacers 212 may comprise a nitride based sidewall spacer (e.g., comprising SiN) or an oxide-based sidewall spacer (e.g., $SiO_2$, SiOC, etc.).

One or more dielectric layers 124 are disposed over the gate electrode 108 and the drift region 204. In some embodiments, the one or more dielectric layers 124 continuously extend from over a portion of the gate electrode 108 to over a portion of the drift region 204. In some embodiments, the one or more dielectric layers 124 may be conformally disposed onto the drift region 204, the gate electrode 108, and the sidewall spacers 212.

A field plate 214 is disposed over the one or more dielectric layers 124 and is laterally surrounded by a first ILD layer 118. The field plate 214 extends from over the gate electrode 108 to over the drift region 204. The size of the field plate 214 may vary depending on the size and characteristics of the LDMOS device 200. In some embodiments, the field plate 214 may have a size that is between approximately 50 nanometers and approximately 1 um. In other embodiments, the field plate 214 may be larger or smaller. In some embodiments, the first ILD layer 118 may comprise a dielectric material having a relatively low dielectric constant (e.g., less than or equal to approximately 3.9), which provides for electrical isolation between the plurality of contacts 120 and/or the field plate 122. In some embodiments, the first ILD layer 118 may comprise an ultra-low k dielectric material or a low-k dielectric material (e.g., SiCO).

The field plate 214 vertically extends from the dielectric layer 124 to a top surface of the first ILD layer 118. In some embodiments, the field plate 214 may vertically extend to a height that is greater than or equal to a height of top surfaces of the contacts 120 and the first ILD layer 118. The field plate 122 has a non-flat surface abutting the one or more dielectric layers 124. The non-flat surface causes the field plate 122 to have a first thickness $t_1$ in a region over the gate electrode 108 and a second thickness $t_2$, larger than the first thickness $t_1$ in a region overlying the drift region 204.

A plurality of contacts 120 are also surrounded by the first ILD layer 118. The plurality of contacts 120 may comprise a first contact 120a coupled to the contact region 208, a second contact 120b coupled to the drain region 106, and a third contact 120c coupled to the gate electrode 108. In some embodiments, the first contact 120a may comprise a butted contact (not shown), which contacts both the contact region 208 and the source region 104. In some embodiments, the plurality of contacts 120 and the field plate 122 may comprise a same metal material. For example, the plurality of contacts 120 and the field plate 122 may comprise one or more of tungsten (W), tantalum-nitride (TaN), titanium (Ti), titanium-nitride (TiN), aluminum copper (AlCu), copper (Cu), and/or other similar conductive materials.

Figure 3:
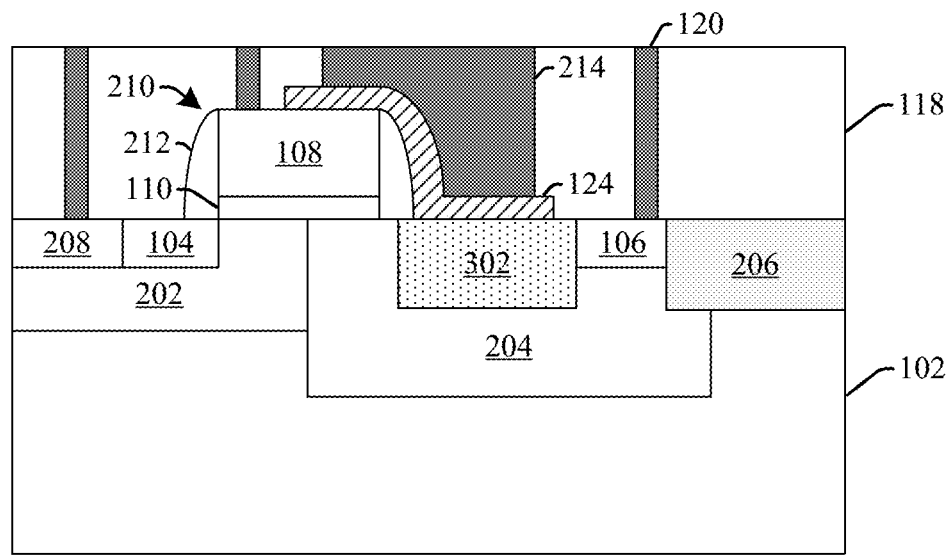

FIG. 3 illustrates a cross-sectional view of some additional embodiments of a disclosed high voltage LDMOS device 300 having a field plate 214.

LDMOS device 300 comprises an isolation region 302 disposed within the drift region 204 at a position that is laterally arranged between the gate structure 214 and the drain region 106. The isolation region 302 improves isolation between the gate structure 210 and the drain region 106, so as to prevent dielectric breakdown between the gate structure 210 and the drift region 204 when the LDMOS device 300 is operated at large operating voltages. For example, the isolation region 302 region may be introduced into the drift region 204 of an LDMOS device, which is designed to operate at a first breakdown voltage, to increase the breakdown voltage of the LDMOS device 300 without significantly changing the fabrication process the LDMOS device. In some embodiments, the isolation region 302 may comprise a shallow trench isolation (STI). In other embodiments, the isolation region 302 may comprise a field oxide.

Figure 4:
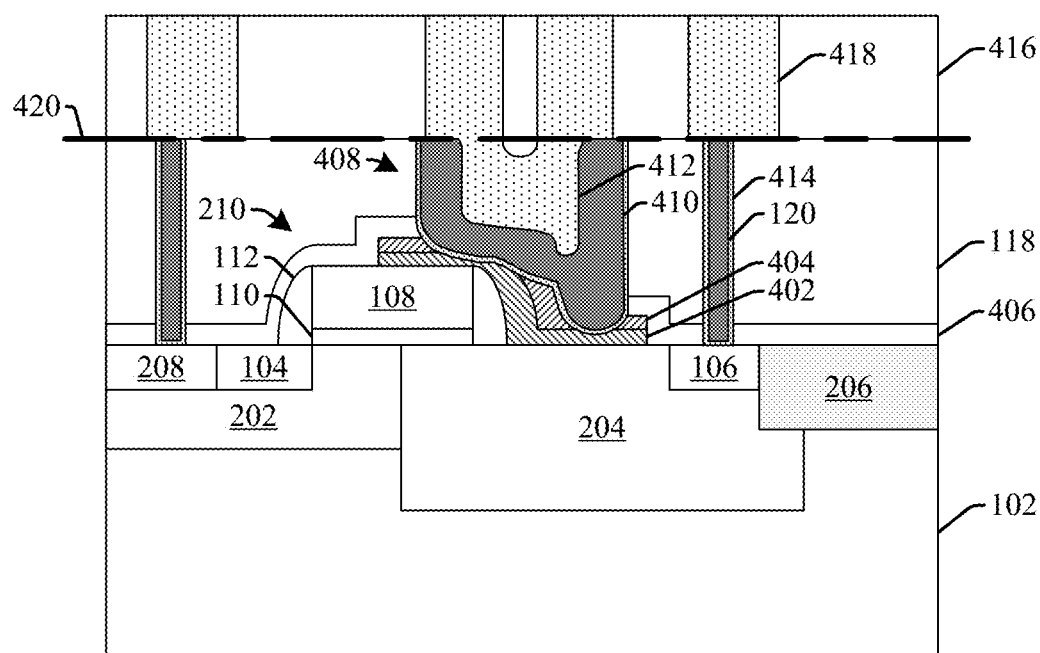

FIG. 4 illustrates a cross-sectional view of some additional embodiments of disclosed high voltage LDMOS device 400 having a field plate 408.

LDMOS device 400 comprises a plurality of dielectric layers 402-404 arranged between the field plate 122 and the gate structure 210 and/or the drift region 204. The plurality of dielectric layers 402-404 are configured to electrically isolate a field plate 408 from the gate structure 210 and/or the drift region 204. In embodiments, the plurality of dielectric layers 402-404 may comprise two or more different dielectric materials. In some embodiments, the plurality of dielectric layers 402-404 may comprise one or more dielectric layers that are used during a typical CMOS fabrication process, so as to limit additional fabrication steps used to electrically isolate the field plate 408 from the gate structure 210 and/or the drift region 204.

For example, the plurality of dielectric layers 402-404 may comprise a silicide blocking layer 402. In some embodiments, the silicide blocking layer 402 may comprise a resist-protection oxide (RPO) layer configured to prevent silicide formation. The silicide blocking layer 402 may be arranged over portions of the gate electrode 108 and the drift region 204. In some embodiments, the silicide blocking layer 402 may continuously extend from over the gate electrode 108 to over the drift region 204.

In some embodiments, the plurality of dielectric layers 402-404 may further comprise a field plate etch stop layer (ESL) 404. The field plate ESL 404 may be disposed over the silicide blocking layer 402 and is configured to control etching of an opening for the field plate 408. The field plate ESL 404 may account for differences in the etch depth between the contacts 120 and the field plate 408 and/or for differences in etching rate (e.g., due to the etch loading effect). In some embodiments, the field plate ESL 404 may comprise a silicon nitride (SiN) layer, for example.

In some alternative embodiments (not shown), the plurality of dielectric layers 402-404 may additionally or alternatively comprise a gate dielectric layer. In such embodiments, the gate dielectric layer may be arranged laterally adjacent to the gate structure 210 at a position that overlies the drift region 204. In some embodiments, the dielectric layer oxide may comprise silicon dioxide (e.g., $SiO_2$) or a high-k gate dielectric material. In yet other embodiments, the plurality of dielectric layers 402-404 may additionally or alternatively comprise an ILD layer (e.g., first ILD layer 118).

A contact etch stop layer (CESL) 406 is disposed over the semiconductor substrate 102 and the field plate ESL 404. In some embodiments, the CESL 406 extends over the semiconductor substrate 102 at positions between the plurality of contacts 120 and the field plate 408, so that the CESL 406 abuts sidewalls of the plurality of contacts 120 and the field plate 408. The CESL 406 overlies the gate structure 210. In some embodiments, the CESL 406 may also overlie the plurality of dielectric layers 402-404. In other embodiments, one or more of the plurality of dielectric layers 402-404 (e.g., the field plate ESL 404) may overlie the CESL 406. In some embodiments, the CESL 406 may comprise a nitride layer. For example, the CESL 406 may comprise silicon nitride (SiN).

A field plate 408 is disposed within first ILD layer 118 and abuts the CESL 406 and one or more of the plurality of dielectric layers 402-404. In some embodiments, the field plate 408 extends though the CESL 406 to abut one or more of the plurality of dielectric layers 402-404. In such embodiments, one or more of the plurality of dielectric layers 402-404 separate the field plate 408 from the gate structure 210 and the drift region 204.

In some embodiments, the field plate 408 may comprise a first metal material 410 and a second metal material 412. The first metal material 410 may comprise a glue layer that is disposed along outer edges of the field plate 408, while the second metal material 412 is embedded within the first metal material 410 in an inner region of the field plate 408 (i.e., the second metal material 412 is separated from the CESL 406 by way of the first metal material 410). In some embodiments, a liner layer 414 may be disposed between the first ILD layer 118 and the first metal material 410.

In some embodiments, the first metal material 410 disposed along outer edges of the field plate 408 has a top surface that is arranged along a substantially planar surface 420 (i.e., a planar surface formed by a planarization process). The planar surface 420 may be aligned with top surfaces of the plurality of contacts 120. In some embodiments, the first metal material 410 comprises a same material as the plurality of contacts 120 and the second metal material 412 comprises a same material as a first metal wire layer 418 overlying the plurality of contacts 120. For example, in some embodiments, the first metal material 410 may comprise tungsten (W), titanium (Ti), tantalum nitride (TaN) or titanium nitride (TiN). In some embodiments, the second metal material 412 may comprise copper (Cu) or aluminum copper (AlCu).

It will be appreciated that due to its integration with the BEOL (back-end-of-the-line) metallization layers, the disclosed field plate allows for various field plate bias configurations to be easily achieved for different design considerations. For example, the field plate biasing can be changed by changing a metal routing layer rather than by changing a design of a disclosed high voltage device. Furthermore, it will be appreciated that biasing the high voltage transistor device by way of BEOL metal interconnect routing allows for a variety of field plate bias configurations to be integrated on a same chip using a single fabrication process flow.

Figure 5:
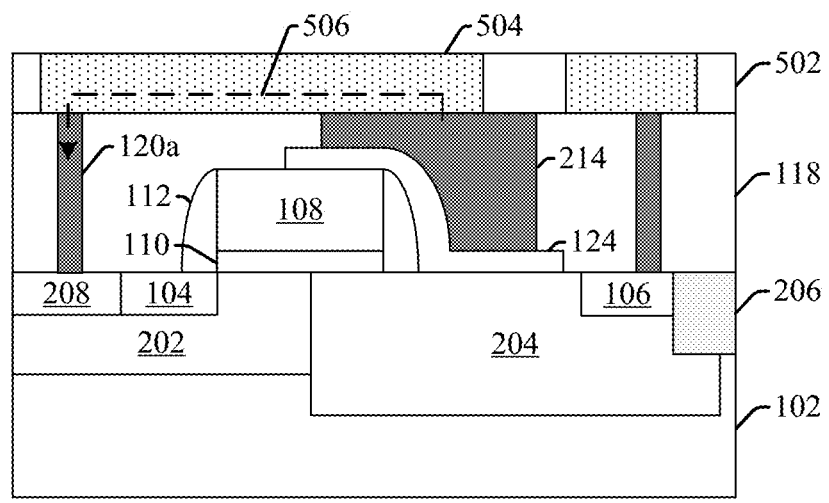
FIGS. 5-6 illustrate cross-sectional views of some embodiments of field plate biasing configurations for a high voltage LDMOS device achieved by metal interconnect routing.
Figure 6:
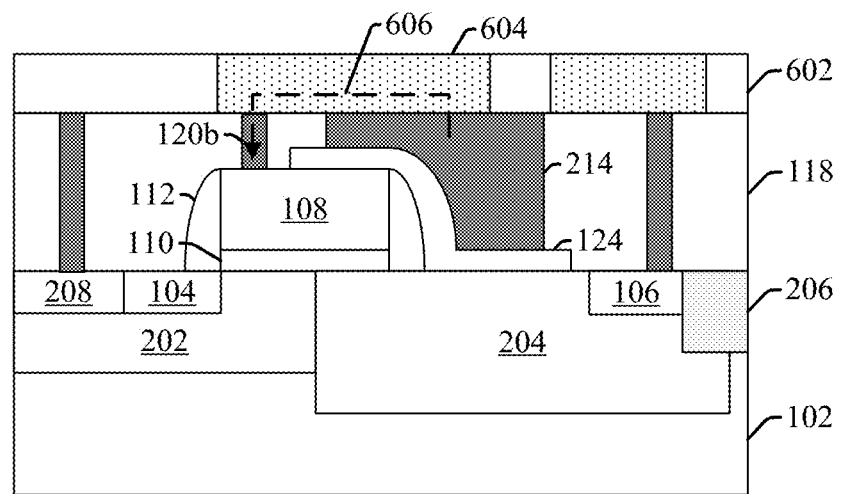

FIGS. 5-6 illustrate cross-sectional views of some embodiments of field plate biasing configurations for a high voltage transistor device achieved by BEOL metal interconnect routing. Although FIGS. 5-6 illustrate a connection between the field plate 214 and the contact region 208 or gate electrode 108 by way of a first metal wire layer (e.g., 504 or 604), the BEOL metal interconnect routing is not limited thereto. Rather, it will be appreciated that the field plate 214 can be connected to a source region, a gate electrode, a drain region, or a bulk contact by any combination of BEOL metal interconnect layers (e.g., a first metal wire layer, a first metal via layer, a second metal wire layer, etc.).

FIG. 5 illustrates a cross-sectional view of a high voltage LDMOS device 500 in which the field plate 214 is electrically coupled to the contact region 208 along conduction path 506. The field plate 214 is connected to a first metal wire layer 504 disposed within a second ILD layer 502. The first metal wire layer 504 is coupled to a contact 120a that abuts the contact region 208. By electrically coupling the field plate 214 to the contact region 208, the field plate 214 is biased by the source voltage. Biasing the field plate 214 by the source voltage provides high voltage LDMOS device 500 with a low on-state resistance Rds(on) and low dynamic power dissipation (e.g., low Rds(on)*Qgd vs. BV). The low dynamic power dissipation provides for good performance during high frequency switching applications.

FIG. 6 illustrates a cross-sectional view of a high voltage LDMOS device 600 in which the field plate 214 is electrically coupled to the gate electrode 108 along conduction path 606. The field plate 214 is connected to a first metal wire layer 604 disposed within a second ILD layer 602. The first metal wire layer 604 is connected to a contact 120b that abuts the gate electrode 108. By electrically coupling the field plate 214 to the gate electrode 108, the field plate 214 is biased by the gate voltage. Biasing the field plate 214 by the gate voltage provides high voltage LDMOS device 600 with a low Rds(on) vs. breakdown voltage.

The variety of field plate bias configurations allow for the disclosed field plate to form a versatile high voltage transistor device that can be used for different applications. For example, the on-state resistance Rds(on) of a high voltage transistor device having a gate bias field plate is lower than the Rds(on) of a high voltage transistor device having a source biased field plate. However, the Rds(on))*Qgd of a high voltage transistor device having a source bias field plate is lower than the Rds(on))*Qgd of a high voltage transistor device having a gate source biased field plate. Therefore, a high voltage transistor device having a gate bias field plate (e.g., high voltage LDMOS device 500) may be used in low frequency switching applications (e.g., below 10 MHz), while a high voltage transistor device having a source bias field plate (e.g., high voltage LDMOS device 600) may be used in high frequency switching applications (e.g., above 10 MHz).

Figure 7A:
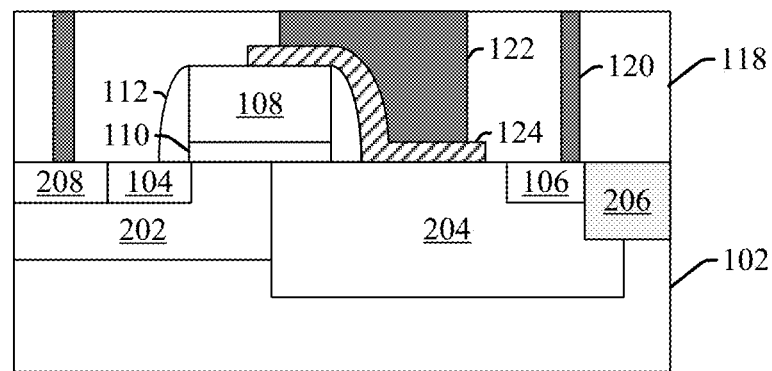
FIGS. 7A-7C illustrate cross-sectional views of some embodiments of high voltage LDMOS devices in different switching isolation configurations.
Figure 7B:
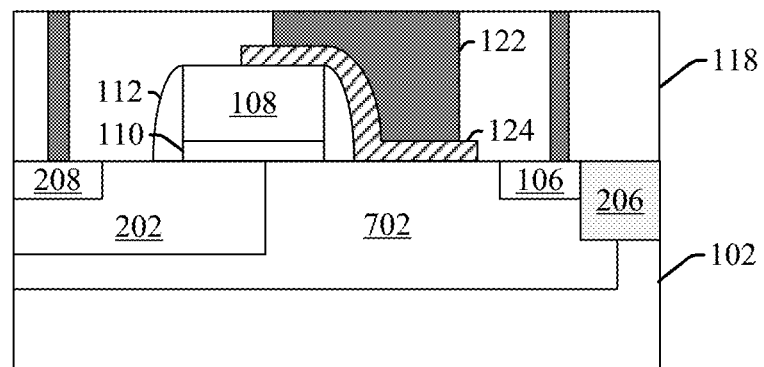
Figure 7C:
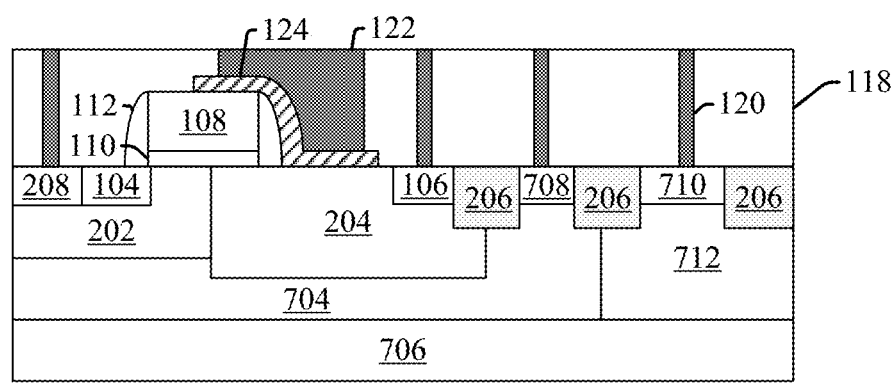

FIGS. 7A-7C illustrate cross-sectional views of some embodiments of high voltage LDMOS devices 700a-700c in different switching isolation configurations.

As shown in FIG. 700a, high voltage LDMOS device 700a is configured as a low-side switch (e.g., a switch connected to ground in an inverter). In such a configuration, the high voltage LDMOS device 700a has a source region 104 that is floating so that the voltage on the source region 104 can change during switching cycles.

As shown in FIG. 700b, high voltage LDMOS device 700b is configured as a high-side switch (e.g., a switch connected to $V_{DD}$ in an inverter). In such a configuration, the high voltage LDMOS device 700b has a source region 104 that is connected to a source voltage. The high voltage LDMOS device 700b has a drift region 702 that extends below the body region 202 to prevent the source voltage from being raised over the substrate voltage by preventing charge carriers from traveling from the contact region 208 to the substrate 102 (e.g., by way of punch through).

As shown in FIG. 700c, high voltage LDMOS device 700c is fully isolated from the substrate to allow for independent biasing. The high voltage transistor device 700c comprises a deep well 704 and an oppositely doped underlying buried layer 706 configured to provide for vertical isolation. In some embodiments, the deep well 704 may have the first doping type (e.g., a same doping type as the body region 202) and the buried layer 706 may the second doping type.

The high voltage LDMOS device 700c further comprises one or more additional STI regions 206 that laterally separate the drain region from a bulk region 708 and a buried layer 710 having the second doping type. The bulk region 708 overlies the deep well 704 and the buried layer 710 overlies a well region 712 having second first doping type and abutting the buried layer 706. Contacts 120 are configured to provide for biasing voltages to the bulk region 708 and the buried layer 710, so as to form junction isolation between the deep well 704 and the buried layer 706 and the well region 712. The junction isolation allows the fully isolated, high voltage LDMOS device 700c to operate over a range of bias voltages.

FIG. 8 illustrates a cross-sectional view of a source downward high voltage transistor device 800 having a field plate 214.

The high voltage transistor device 800 comprises substrate 802 having a first doping type (e.g., a p+ doping type) with a high doping concentration. A source region 804 disposed along a backside 802b of a substrate 802. In various embodiments, the source region 804 may comprise a highly doped region or a metal layer. An epitaxial layer 806 having the first conductivity type is disposed over a front side surface 802f of the substrate 802. The dopant concentration of the epitaxial layer 806 is less than the dopant concentration of the substrate 802. A source contact region 810, a drain region 106, a body region 808, and a drift region 204 are disposed within a top surface of the epitaxial layer 806.

A conductive material 812 extends from the top surface of the epitaxial layer 806 to the substrate 802. The conductive material 812 may comprise a highly doped deep well region. The conductive material 812 allows for a source connection to be made from the backside of the substrate 802, thereby reducing metal routing complexity and enabling various packaging compatibility. In some embodiments, the field plate 214 may be biased by the source voltage, by way of an electrical path 818 extending through a contact 814 abutting the conductive material 812 and an overlying metal wire layer 816 coupled to the field plate 214.

FIGS. 9A-9B illustrate some embodiments of a disclosed high voltage LDMOS device having a field plate 902 in a metal wire layer. Although FIGS. 9A-9B illustrate the field plate as being on a first metal wire layer, it will be appreciated that the disclosed field plate is not limited to a first metal wire layer, but rather may be implemented on alternative layers of a BEOL metallization stack.

As shown in cross-sectional view 900, of FIG. 9A, the field plate 902 is disposed in a first metal wire layer within a second ILD layer 904 overlying a first ILD layer 118. In some embodiments, the field plate 902 has substantially planar top and bottom surfaces so as to give the field plate 902 a planar topology. The field plate 902 is vertically separated from the gate structure 210 and the drift region 204 by way of the first ILD layer 118. The field plate 902 overlies portions of the gate electrode 108 and the drift region 204 and is laterally separated from the source region 104 and the drain region 106. For example, the field plate 902 may be laterally separated from the drain region 106 by a distance d. In some embodiments, the field plate 902 may laterally extend from over the gate electrode 108 to over the drift region 204.

As shown in top view 906, of FIG. 9B, the field plate 902 comprises a metal structure overlying portions of the gate electrode 108 and the drift region 204. The metal structure is not connected to an underlying element by way of a contact 120 or to another metal structure on the first metal wire layer. Rather, the metal structure will be connected to an overlying via (not shown) configured to connect the field plate to an overlying metal wire layer that enables the field plate 902 to be biased.

FIG. 10 illustrates some embodiments of a disclosed high voltage LDMOS device 1000 having a self-aligned drift region 1002.

The self-aligned drift region 1002 has a sidewall 1002s that is substantially aligned with a sidewall of the gate electrode 108 and the gate dielectric layer 110. In some alternative embodiments, the self-aligned drift region 1002 may be formed to have a sidewall 1002s that is substantially aligned with an edge of a sidewall spacer 212. By aligning the self-aligned drift region 1002 with a sidewall of the gate electrode 108 and the gate dielectric layer 110, the self-aligned drift region 1002 is laterally separated from the body region 202 by a spacing s, thereby minimizing gate-to-drain overlap and achieving low gate-drain charge (Qgd) and good high frequency performance. The field plate 214 overlying the self-aligned drift region 1002 can further reduce the gate-drain charge (Qgd).

Figure 11:
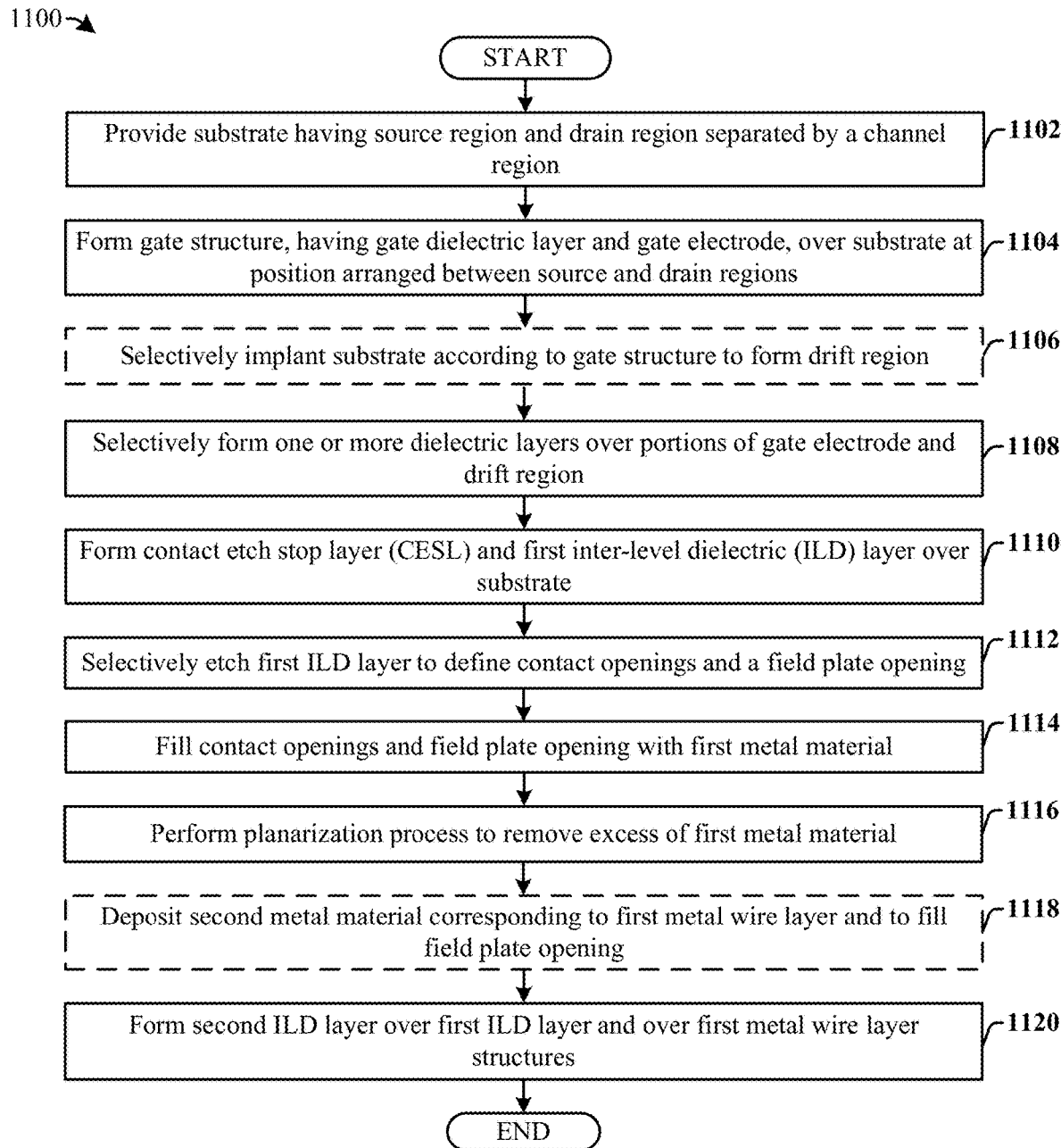
FIG. 11 illustrates a flow diagram of some embodiments of a method of forming a high voltage transistor device having a field plate.

FIG. 11 illustrates a flow diagram of some embodiments of a method 1100 of forming a high voltage transistor device having a field plate. The method may form the field plate using process steps that are already used during a standard CMOS fabrication process, and therefore can provide for a low cost, versatile field plate.

While the disclosed method 1100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a substrate is provided having a source region and a drain region separated by a channel region. In some embodiments, the substrate may further comprise a drift region located between the source region and the drain region at a position adjacent to the channel region and.

At 1104, a gate structure is formed over the substrate at a position arranged between the source region and the drain region. The gate structure may comprise a gate dielectric layer and an overlying gate electrode.

At 1106, the drift region may be formed using a self aligned process, which selectively implants the semiconductor substrate according to the gate structure to form a drift region, in some embodiments.

At 1108, one or more dielectric layers are selectively formed over a portion of the gate electrode and the drift region.

At 1110, a contact etch stop layer (CESL) and a first inter-level dielectric (ILD) layer are formed over the substrate.

At 1112, the first ILD layer is selectively etched to define contacts openings and a field plate opening.

At 1114, the contact openings and the field plate opening is filled with a first metal material.

At 1116, a planarization process may be performed to remove excess of the first metal material overlying the first ILD layer.

At 1118, a second metal material corresponding to a first metal wire layer is deposited. In some embodiments, the second metal material may further fill the field plate opening. In such embodiments, the second metal material is embedded within the first metal material within the field plate opening.

At 1120, a second inter-level dielectric (ILD) layer is formed over the first ILD layer and over first metal wire layer structures.

FIGS. 12-19 illustrate cross-sectional views of some embodiments showing a method of forming a MOSFET device having a field plate. Although FIGS. 12-19 are described in relation to method 1100, it will be appreciated that the structures disclosed in FIGS. 12-19 are not limited to such a method, but instead may stand alone as structures independent of the method.

Figure 12:
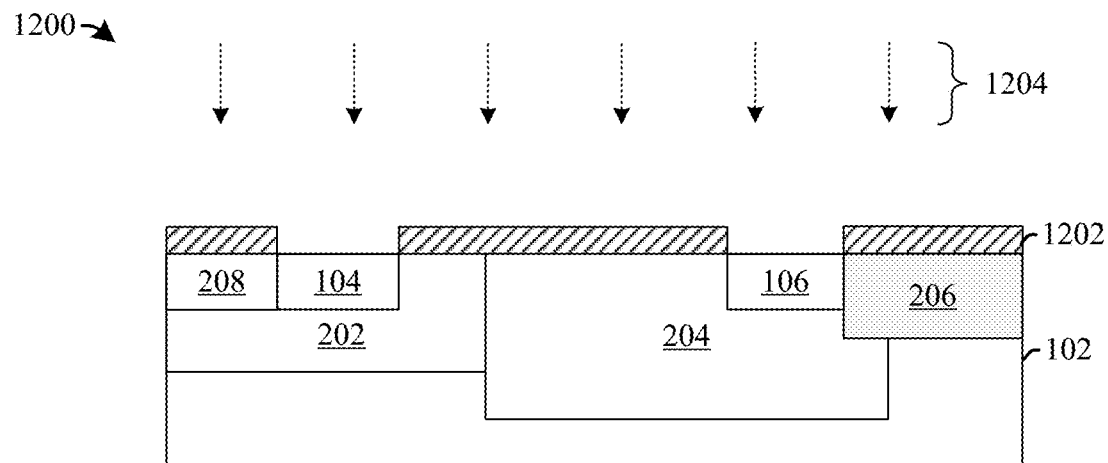
FIGS. 12-19 illustrate cross-sectional views of some embodiments showing a method of forming a high voltage transistor device having a field plate.

FIG. 12 illustrates some embodiments of a cross-sectional view 1200 corresponding to act 1102.

As shown in cross-sectional view 1200, a semiconductor substrate 102 is provided. The semiconductor substrate 102 may be intrinsically doped with a first doping type. In various embodiments, the semiconductor substrate 102 may comprise any type of semiconductor body (e.g., silicon, SOI), which includes, but is not limited to a semiconductor die or wafer or one or more die on a wafer, as well as any other type of semiconductor and/or epitaxial layers formed thereon and/or otherwise associated therewith.

The semiconductor substrate 102 may be selectively implanted using various implantation steps to form a plurality of implantation regions (e.g., well regions, contact regions, etc.). For example, the semiconductor substrate 102 may be selectively implanted to form a body region 202, a drift region 204, a source region 104, a drain region 106, and a contact region 208. The plurality of implantation regions may be formed by selectively masking the semiconductor substrate 102 (e.g., using a photoresist mask) and then introducing high-energy dopants 1204 (e.g., p-type dopant species such as boron or n-type dopants such as phosphorous) into exposed areas of the semiconductor substrate 102. For example, as shown in cross-sectional view 1200, a masking layer 1202 is selectively patterned to expose portions of the semiconductor substrate 102, into which high-energy dopants 1204 are subsequently implanted to form source region 104 and drain region 106.

It will be appreciated that the implantation regions shown in cross-sectional view 1200 are one example of possible implantation regions and that the semiconductor substrate 102 may comprise other configurations of implantation regions, such as any of those illustrated in FIGS. 1-10, for example.

Figure 13:
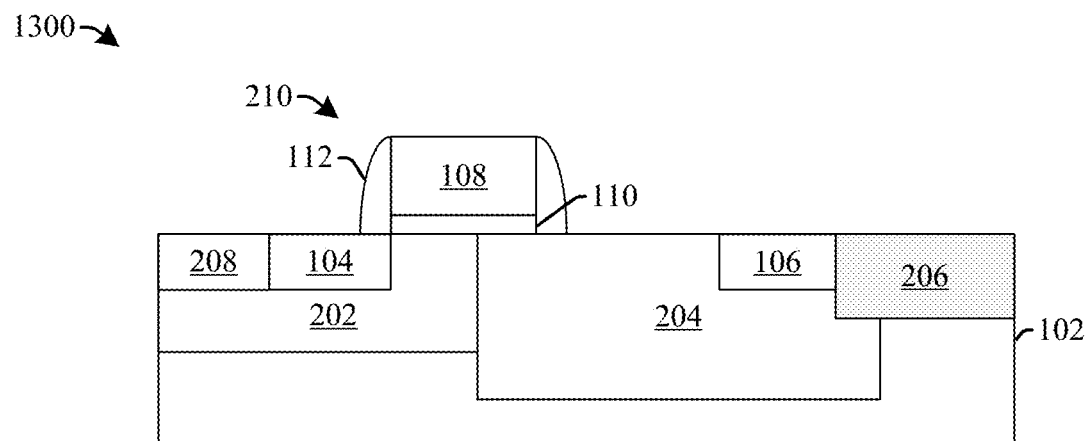

FIG. 13 illustrates some embodiments of a cross-sectional view 1300 corresponding to act 1104.

As shown in cross-sectional view 1300, a gate structure 210 is formed over a semiconductor substrate 102 at a position arranged between the source region 104 and the drain region 106. The gate structure 210 may be formed by forming a gate dielectric layer 110 over the semiconductor substrate 102, and by forming a gate electrode material 108 over the gate dielectric layer 110. In some embodiments, the gate dielectric layer 110 and the gate electrode material 108 may be deposited by a vapor deposition technique. The gate dielectric layer 110 and the gate electrode material 108 may be subsequently patterned and etched (e.g., according to a photoresist mask) to define the gate structure 210. In some embodiments, the sidewall spacers 212 may be formed on opposing sides of the gate electrode 108 by depositing a nitride or oxide based material onto the semiconductor substrate 102, and selectively etching the nitride or oxide based material to form the sidewall spacers 212.

Figure 14:
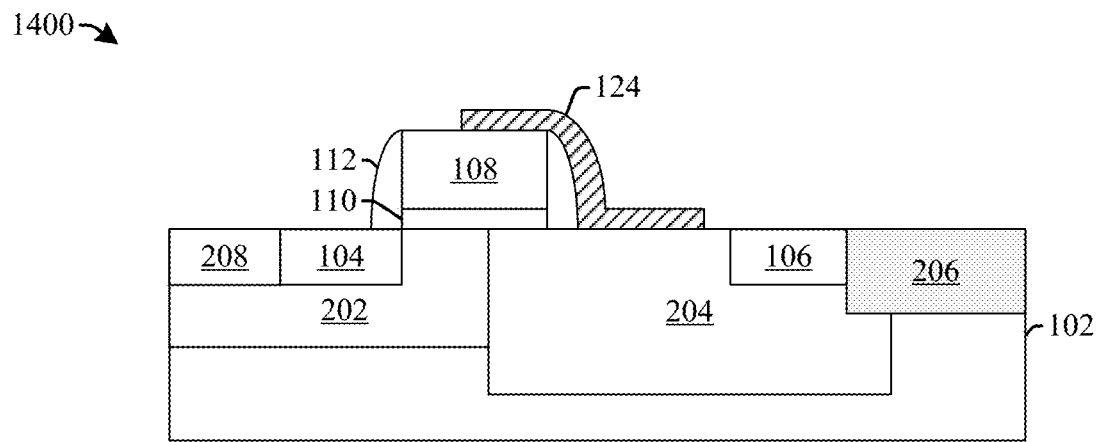

FIG. 14 illustrates some embodiments of a cross-sectional view 1400 corresponding to act 1108.

As shown in cross-sectional view 1400, one or more dielectric layers 124 are selectively formed over the gate electrode 108 and the drift region 204. In some embodiments, the one or more dielectric layers 124 may be deposited by a vapor deposition technique, and subsequently patterned and etched (e.g., according to a photoresist mask). In some embodiments, the one or more dielectric layers 124 may be etched to expose a portion of the gate electrode 108 and to be laterally spaced apart from the drain region 106.

In some embodiments, the one or more dielectric layers 124 may comprise a silicide blocking layer, such as a resist-protection oxide (RPO) layer. In other embodiments, the one or more dielectric layers 124 may further and/or alternatively comprise a field plate etch stop layer (ESL). In some embodiments, the field plate ESL may be a silicon nitride (SiN) layer formed by a vapor deposition technique. In yet other embodiments, the one or more dielectric layers 124 may further and/or alternatively comprise a gate dielectric layer or an inter-level dielectric (ILD) layer.

Figure 15:
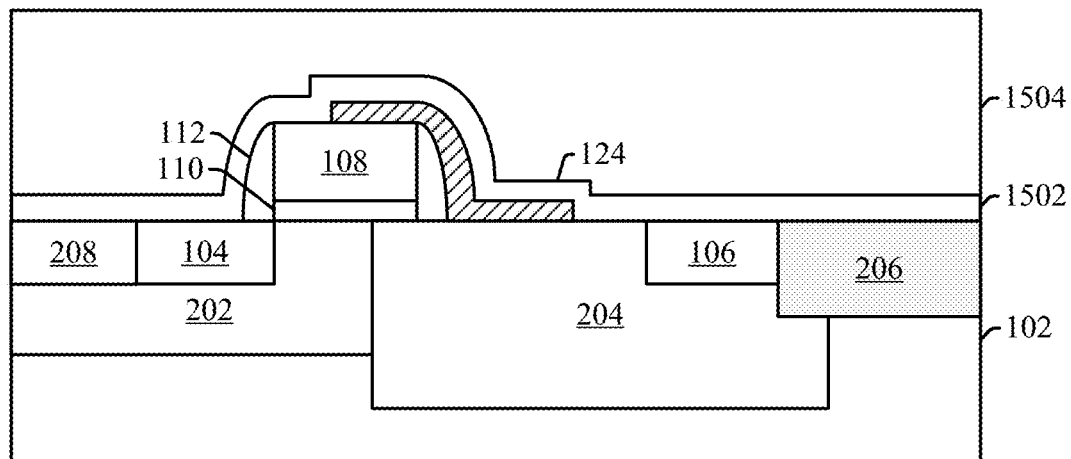

FIG. 15 illustrates some embodiments of a cross-sectional view 1500 corresponding to act 1110.

As shown in cross-sectional view 1500, a contact etch stop layer (CESL) 1502 is formed over the semiconductor substrate 102. In some embodiments, the CESL 1502 may be formed by a vapor deposition process. A first inter-level dielectric (ILD) layer 1504 is then formed over the CESL 1502. In some embodiments, the first ILD layer 1504 may comprise an ultra-low k dielectric material or a low-k dielectric material (e.g., SiCO). In some embodiments, the first ILD layer 1504 may also be formed by a vapor deposition process. In other embodiments, the first ILD layer 1504 may be formed by a spin coating process. It will be appreciated that the term inter-level dielectric (ILD) layer as used herein may also refer to inter-metal dielectric (IMD) layers.

Figure 16:
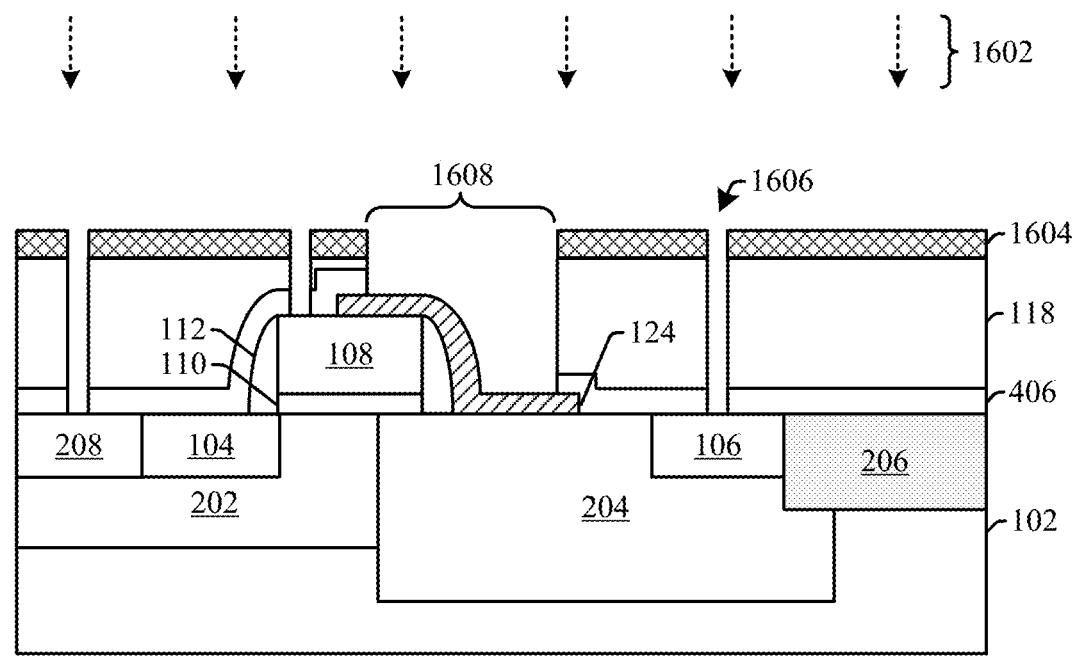

FIG. 16 illustrates some embodiments of a cross-sectional view 1600 corresponding to act 1112.

As shown in cross-sectional view 1600, the first ILD layer 1504 is selectively exposed to a first etchant 1602 configured to form contacts openings 1606 and a field plate opening 1608. In some embodiments, the contact openings 1606 may be smaller than the field plate opening 1608. In some embodiments, the first ILD layer 1504 is selectively exposed to the first etchant 1602 according to a masking layer 1604 (e.g., a photoresist layer or a hard mask layer). In some embodiments, the first etchant 1602 may have a large etching selectivity between the first ILD layer 1504 and a field plate ESL within the one or more dielectric layers 124. In some embodiments, the first etchant 1602 may comprise a dry etchant. In some embodiments, the dry etchant may have an etching chemistry comprising one or more of oxygen ($O_2$), nitrogen ($N_2$), hydrogen ($H_2$), argon (Ar), and/or a fluorine species (e.g., $CF_4$, $CHF_3$, $C_4F_8$, etc.). In other embodiments, the first etchant 1602 may comprise a wet etchant comprising a buffered hydrofluoric acid (BHF).

Figure 17:
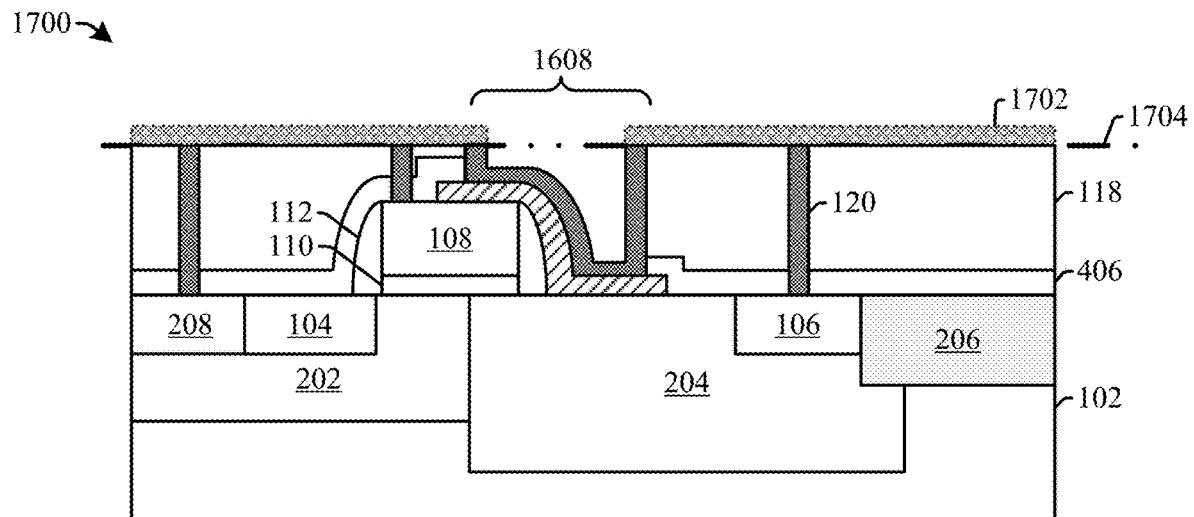

FIG. 17 illustrates some embodiments of a cross-sectional view 1700 corresponding to acts 1114-1116.

As shown in cross-sectional view 1700, the contact openings 1606 and the field plate opening 1608 are filled with a first metal material 1702. In some embodiments, the first metal material 1702 may be deposited by way of a vapor deposition technique (e.g., CVD, PVD, PE-CVD, etc.). In some embodiments, the first metal material 1702 may be formed by depositing a seed layer by way of physical vapor deposition, followed by a plating process (e.g., an electro-plating or electro-less plating process). A planarization process (e.g., chemical mechanical planarization) may be subsequently performed to remove excess of the first metal material 1702 and to form a planar surface along line 1704.

In some embodiments, the first metal material 1702 may comprise tungsten (W), titanium (Ti), titanium nitride (TiN), or tantalum nitride (TaN). In some embodiments, a diffusion barrier layer and/or a liner layer may be deposited into the contact openings 1606 and the field plate opening 1608 prior to depositing the first metal material 1702.

Figure 18:
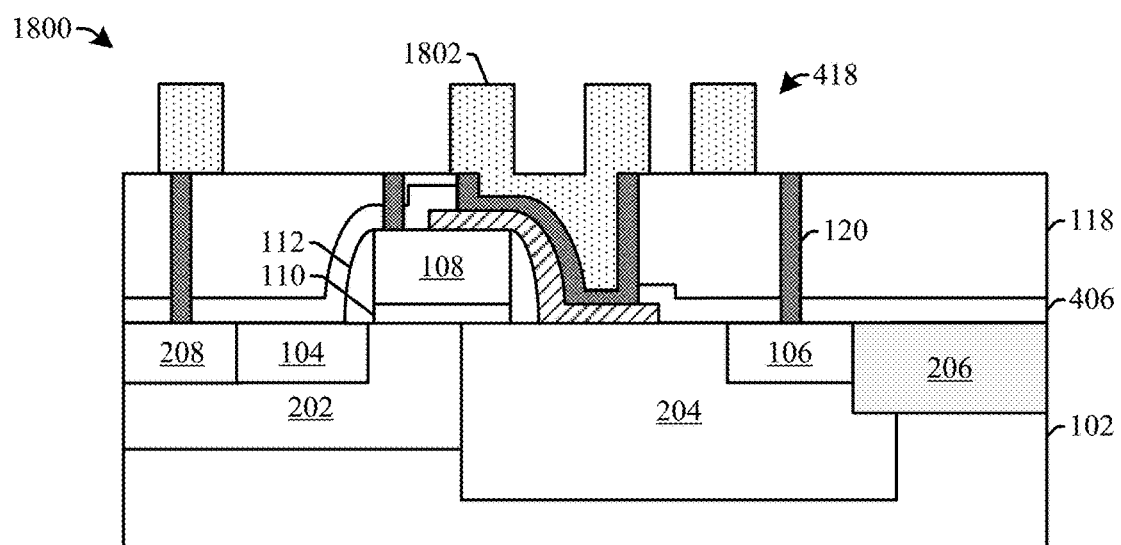

FIG. 18 illustrates some embodiments of a cross-sectional view 1800 corresponding to act 1118.

As shown in cross-sectional view 1800, a second metal material 1802 is deposited. The second metal material 1802 is formed within remaining openings in the field plate opening and over the first ILD layer 118. In some embodiments, the second metal material 1802 may be deposited by way of a vapor deposition technique (e.g., CVD, PVD, PE-CVD, etc.). In some embodiments, the second metal material 1802 may be formed by depositing a seed layer by way of physical vapor deposition, followed by a plating process. In some embodiments, the second metal material 1802 may comprise copper (Cu) or an aluminum copper (AlCu) alloy.

After formation, the second metal material 1802 may be selectively patterned to define one or more metal structures of a first metal wire layer 418 overlying the first ILD layer 118. In some embodiments, the second metal material 1802 may be selectively patterned by forming a patterned masking layer (e.g., a photoresist layer or a hard mask layer)(not shown) over the second metal material 1802 and by subsequently etching the second metal material 1802 in areas exposed by the patterned masking layer.

Figure 19:
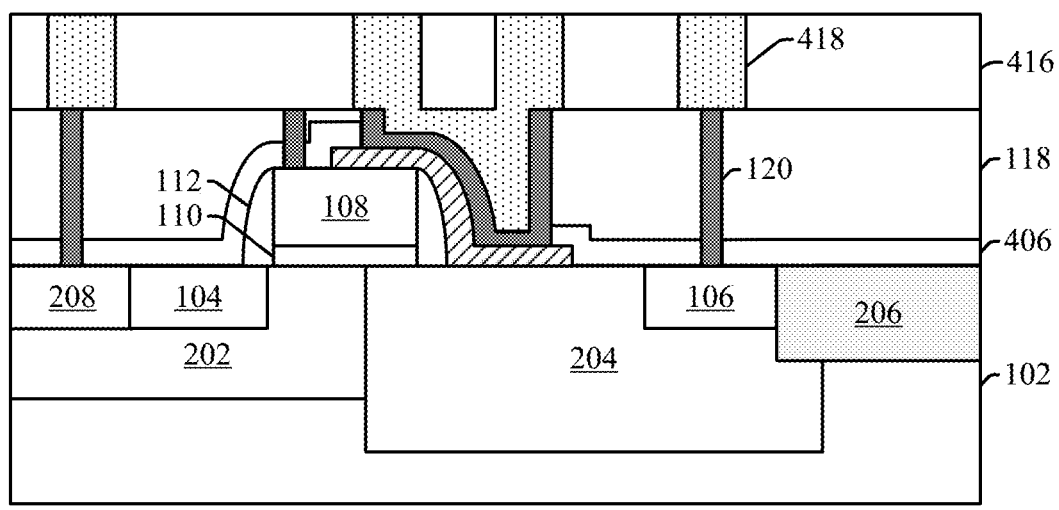

FIG. 19 illustrates some embodiments of a cross-sectional view 1900 corresponding to act 1120.

As shown in cross-sectional view 1900, a second ILD layer 416 is formed over the first ILD layer 118 and the one or more metal structures of a first metal wire layer 418. In various embodiments, the second ILD layer 416 may be formed by depositing a second ILD material over the first ILD layer 118 and the one or more metal structures of the first metal wire layer 418. After the second ILD layer 416 is formed, a planarization process (e.g., CMP) is performed to remove excess of the second ILD layer 416 and to expose top surfaces of the one or more metal structures of the first metal wire layer 418. In various embodiments, the second ILD layer 416 may comprise an ultra-low k dielectric material or a low-k dielectric material (e.g., SiCO) formed by a vapor deposition processor a spin coating process.

Therefore, the present disclosure relates to a transistor device having a field plate that is formed concurrent with a formation of a back-end-of-the-line (BEOL) metal layer to enable a low-cost method of fabrication.

In some embodiments, the present disclosure relates to a transistor device. The transistor device comprises a gate electrode disposed over a substrate between a source region and a drain region. One or more dielectric layers laterally extend from over the gate electrode to a location between the gate electrode and the drain region. A field plate is located within an inter-level dielectric (ILD) layer overlying the substrate. The field plate laterally extends from over the gate electrode to over the location and vertically extends from the one or more dielectric layers to a top surface of the ILD layer. A conductive contact is arranged over the drain region and is surrounded by the ILD layer. The conductive contact extends to the top surface of the ILD layer.

In other embodiments, the present disclosure relates to a transistor device. The transistor device comprises a gate electrode disposed over a substrate between a source region and a drain region. A dielectric layer extends from over the gate electrode to between the gate electrode and the drain region. A field plate laterally extends from over the gate electrode to between the gate electrode and the drain region. The field plate has a first outermost sidewall arranged over the gate electrode and having a first length. The field plate has a second outermost sidewall arranged between the gate electrode and the drain region and having a second length that is larger than the first length.

In yet other embodiments, the present disclosure relates to a transistor device. The transistor device comprises a gate electrode disposed over a substrate between a source region and a drain region. One or more dielectric layers are arranged over the gate electrode. A field plate is arranged over one or more dielectric layers and is set back from an outermost sidewall of the one or more dielectric layers. The field plate extends from above a top surface of the gate electrode to between the gate electrode and the drain region and below the top surface of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
forming a source region and a drain region within a substrate;
forming a gate structure over the substrate and between the source region and the drain region;
forming one or more dielectric layers over the gate structure;
forming a first inter-level dielectric (ILD) layer over the one or more dielectric layers;
etching the first ILD layer to define contact openings and a field plate opening;
forming a first conductive material that completely fills the contact openings and that partially fills the field plate opening; and
forming a second conductive material on the first conductive material and within the field plate opening.

2. The method of claim 1, further comprising:
performing a first planarization process along a top of the first ILD layer, wherein the first planarization process removes excess of the first conductive material from over the first ILD layer.

3. The method of claim 1, wherein the contact openings and the field plate opening are concurrently defined.

4. The method of claim 1, wherein the field plate opening is both laterally and vertically separated from the gate structure.

5. The method of claim 1, wherein the contact openings extend below the field plate opening.

6. The method of claim 1, wherein the field plate opening is defined by a curved surface of the one or more dielectric layers.

7. The method of claim 1, further comprising:
depositing one or more dielectric materials over the gate structure and the substrate; and
patterning the one or more dielectric materials according to a masking layer to define the one or more dielectric layers.

8. The method of claim 1, further comprising:
forming a contact etch stop layer over the one or more dielectric layers.

9. The method of claim 8, further comprising etching the contact etch stop layer and the one or more dielectric layers to form the field plate opening, wherein the field plate opening is defined by sidewalls of the first ILD layer, the contact etch stop layer, and the one or more dielectric layers.

10. The method of claim 1, further comprising implanting a dopant into the substrate to form a drift region between the gate structure and the drain region, wherein the one or more dielectric layers have a first outermost sidewall directly over the gate structure and a second outermost sidewall directly over the drift region.

11. The method of claim 1, wherein the one or more dielectric layers comprise a resist protective oxide and an etch stop layer.

12. A method of forming an integrated chip, comprising:

forming a gate structure over a substrate and between a source region and a drain region;

forming a first inter-level dielectric (ILD) layer over the substrate and the gate structure;

etching the first ILD layer to concurrently form sidewalls of the first ILD layer that define contact openings and a field plate opening, the field plate opening continuously extending from directly over the gate structure to directly laterally besides the gate structure;

concurrently filling the contact openings and the field plate opening with a conductive material; and performing a first planarization process along a top of the first ILD layer, wherein the first planarization process removes excess of the conductive material from over the first ILD layer to define a field plate extending from directly over the gate structure to laterally between the gate structure and the drain region.

13. The method of claim 12, wherein the field plate opening continuously extends from directly over a top of the gate structure to vertically below the top of the gate structure.

14. The method of claim 12, further comprising:

forming one or more dielectric layers over the gate structure, wherein the first ILD layer is formed over the one or more dielectric layers; and wherein the field plate has opposing outermost sidewalls that vertically extend from the one or more dielectric layers to an upper surface of the first ILD layer.

15. The method of claim 12, wherein the field plate opening has a greater width than respective ones of the contact openings.

16. A method of forming an integrated chip, comprising:

forming a source region and a drain region within a substrate;

forming a gate structure over the substrate at a position between the source region and the drain region;

forming one or more dielectric layers over the gate structure;

concurrently forming a field plate over the one or more dielectric layers and conductive contacts vertically extending to below a bottom of the field plate and electrically coupled to the source region and the drain region, wherein the field plate is wider than respective ones of the conductive contacts; and wherein the field plate vertically extends from below a top of the gate structure to above the top of the gate structure and laterally extends from directly over the gate structure to outside of the gate structure.

17. The method of claim 16, wherein the field plate has a first outermost sidewall that is directly over the top of the gate structure and that has a first height and a second outermost sidewall that is between the first outermost sidewall and the drain region and that has a second height that is larger than the first height.

18. The method of claim 16, further comprising:

forming an inter-level dielectric (ILD) layer over the one or more dielectric layers, wherein the field plate and the conductive contacts extend to a top of the ILD layer.

19. The method of claim 16, wherein the one or more dielectric layers continuously extend past opposing outermost sidewalls of the field plate.

20. The method of claim 16, wherein the one or more dielectric layers have an outermost sidewall that is directly over the gate structure and laterally outside of the field plate.

* * * * *